(12) United States Patent
Miller et al.

(10) Patent No.: US 10,204,323 B1
(45) Date of Patent: Feb. 12, 2019

(54) MAINTENANCE OF A FLEET OF AIRCRAFT

(71) Applicant: THE BOEING COMPANY, Chicago, IL (US)

(72) Inventors: Adrienne Pauline Miller, Tukwila, WA (US); Bradley A. Lasater, Berkeley, MO (US); Steven S. Yager, Berkeley, MO (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/831,701

(22) Filed: Dec. 5, 2017

(51) Int. Cl.
    *G06Q 10/00* (2012.01)
    *G07C 5/00* (2006.01)
    *G06F 17/50* (2006.01)
    *B64D 45/00* (2006.01)

(52) U.S. Cl.
    CPC ............. *G06Q 10/20* (2013.01); *G06F 17/50* (2013.01); *G07C 5/006* (2013.01); *G07C 5/008* (2013.01); *B64D 2045/0085* (2013.01)

(58) Field of Classification Search
    CPC ........ G06Q 10/20; G06F 17/50; G07C 5/006; G07C 5/008; B64D 2045/0085

USPC .................................................. 701/29.4, 13
See application file for complete search history.

(56) References Cited

U.S. PATENT DOCUMENTS

| | | | | |
|---|---|---|---|---|
| 7,349,825 B1 * | 3/2008 | Williams | ............... | G06Q 10/06 702/182 |
| 9,251,502 B2 * | 2/2016 | Schoonveld | ........... | G06Q 10/10 |
| 2015/0019065 A1 * | 1/2015 | Bollapragada | ............ | B64F 5/40 701/29.1 |

* cited by examiner

*Primary Examiner* — Gertrude Arthur Jeanglaude
(74) *Attorney, Agent, or Firm* — Womble Bond Dickinson (US) LLP

(57) ABSTRACT

A method of supporting and performing maintenance on a fleet of aircraft is provided. The method includes generating a computer model that describes a process performed by a system for in-service operation and maintenance of the fleet of aircraft. The method also includes performing a discrete event simulation of the process, via a computer processor configured to access the computer model and generating a maintenance schedule or certifying the predefined maintenance schedule for the fleet of aircraft from the discrete event simulation of the process. The method further includes performing maintenance on the fleet of aircraft by the system according to the maintenance schedule or the predefined maintenance schedule.

20 Claims, 9 Drawing Sheets

MAINTENANCE OF A FLEET OF AIRCRAFT

TECHNOLOGICAL FIELD

The present disclosure relates generally to maintenance of a fleet of aircraft, in particular, to using discrete event simulation to support maintenance of a fleet of aircraft.

BACKGROUND

Maintenance is regularly performed on aircraft for repair, update, or replacement of aircraft parts to keep the aircraft in a safe condition for in-service operation. Performing maintenance has a direct effect on the in-service availability of aircraft, with it generally being desirable to reduce or minimize aircraft downtime during maintenance in which the aircraft is out of service. However, reducing or minimizing aircraft downtime during maintenance is a complicated task involving multiple variables such as the age or in-service usage of the fleet of aircraft, the inventory of aircraft parts, the availability of facilities at the locations for performing maintenance on the fleet of aircraft, and the locations of the aircraft. The interplay of these variables makes reducing or minimizing aircraft downtime during maintenance challenging. For example, facilities may be available to perform maintenance for an aircraft at one location while the aircraft may be stationed at another faraway location.

Techniques exist for scheduling and performing maintenance according to schedules that account for at least some of the relevant variables. These existing methods are time consuming and provide no assessment and analysis regarding expected maintenance performance using maintenance schedules. These existing methods may not be able to reduce or minimize aircraft downtime during maintenance of a fleet of aircraft.

Therefore it would be desirable to have a system and method that take into account at least some of the issues discussed above, as well as other possible issues.

BRIEF SUMMARY

Example implementations of the present disclosure are directed to maintaining a fleet of aircraft using discrete event simulation to support maintenance in a manner that reduces aircraft downtime relative to existing methods. In contrast to the existing methods, example implementations provide a tool to dynamically store and update variables involved in the maintenance. Example implementations can propose or certify maintenance schedules to support maintenance on the fleet of aircraft. Also, example implementations can provide quantitative assessments of expected maintenance performance using the maintenance schedules.

The present disclosure thus includes, without limitation, the following example implementations.

Some example implementations provide a method of performing maintenance on a fleet of aircraft, the method comprising: generating a computer model that describes a process performed by a system for in-service operation and maintenance of the fleet of aircraft, wherein the computer model comprises interconnected data objects and modules, the data objects describing at least the fleet of aircraft and a plurality of locations of the system available to perform maintenance on the fleet of aircraft, and the modules describing operations performed by the fleet of aircraft and the system, the data objects and the modules including at least: a first data object that includes aircraft attributes that describe aircraft of the fleet of aircraft; a second data object that includes location attributes that describe capacity of the plurality of locations to perform maintenance on aircraft of the fleet of aircraft; an in-service operation module that describes in-service operation of the fleet of aircraft, at least some of the aircraft attributes of the first data object being updateable based on the in-service operation of the fleet of aircraft; a location determination module that describes operation of the system to determine a location from the plurality of locations to perform maintenance on an aircraft of the fleet of aircraft based on the aircraft attributes of the first data object or a demand for maintenance from a predefined maintenance schedule, and based on the location attributes of the second data object; and a maintenance module that describes operation of the system to perform maintenance on the aircraft at the location; performing a discrete event simulation of the process, via a computer processor configured to access the computer model, to at least execute the modules including the in-service operation module, the location determination module and the maintenance module through a sequence of time-ordered discrete events; generating a maintenance schedule or certifying the predefined maintenance schedule for the fleet of aircraft from the discrete event simulation of the process; and performing maintenance on the fleet of aircraft by the system according to the maintenance schedule or the predefined maintenance schedule.

In some example implementations of the method of any preceding example implementation, or any combination of preceding example implementations, performing the discrete event simulation of the process includes performing the discrete event simulation to execute the in-service operation module and the maintenance module, and from which the at least some of the aircraft attributes of the first data object are updated, including, for each aircraft of the fleet of aircraft, an age, a number of flight hours, an inspection status indicating past maintenance, or a current state indicating current in-service operation.

In some example implementations of the method of any preceding example implementation, or any combination of preceding example implementations, performing the discrete event simulation of the process includes performing the discrete event simulation to execute the location determination module to determine the location from the plurality of locations to perform maintenance on the aircraft of the fleet of aircraft using the second data object in which the location attributes of the plurality of locations include, for each location of the plurality of locations, a total capacity to perform maintenance, a current capacity to perform maintenance, or a work placement priority to accept a new maintenance task.

In some example implementations of the method of any preceding example implementation, or any combination of preceding example implementations, the data objects and the modules further include a plurality of third data objects that includes task attributes that describe a capability of the plurality of locations to perform maintenance tasks on aircraft of the fleet of aircraft, and performing the discrete event simulation of the process includes performing the discrete event simulation to execute the location determination module to determine the location from the plurality of locations to perform maintenance on the aircraft of the fleet of aircraft further based on the task attributes of the plurality of third data objects.

In some example implementations of the method of any preceding example implementation, or any combination of preceding example implementations, generating the computer model further including the plurality of third data objects in which the task attributes include, for each location of the plurality of locations, a baseline time to complete a maintenance task, a baseline priority of a maintenance task, or a priority of work-in-progress (WIP) adjustment.

In some example implementations of the method of any preceding example implementation, or any combination of preceding example implementations, the data objects and the modules further include an estimation module that describes operation of the system to estimate a difficulty to perform a maintenance task on the aircraft of the fleet of aircraft based on the aircraft attributes, the difficulty indicating required task attributes to perform the maintenance task on the aircraft, and performing the discrete event simulation of the process includes performing the discrete event simulation to execute the estimation module to estimate the difficulty and thereby determine the required task attributes, and execute the location determination module to determine the location with task attributes matching the required task attributes to perform the maintenance task on the aircraft.

In some example implementations of the method of any preceding example implementation, or any combination of preceding example implementations, generating the maintenance schedule includes generating the maintenance schedule that satisfies predefined criteria including a time period that aircraft of the fleet of aircraft are out of service, and wherein certifying the predefined maintenance schedule includes certifying that the predefined maintenance schedule satisfies the predefined criteria.

In some example implementations of the method of any preceding example implementation, or any combination of preceding example implementations, the data objects and the modules further include a plurality of fourth data objects that include spare part attributes that describe available spare parts used at the plurality of locations to perform maintenance tasks on aircraft of the fleet of aircraft, and performing the discrete event simulation of the process includes performing the discrete event simulation to execute the maintenance module to perform maintenance on the aircraft at the location based on the spare part attributes of a respective one of the plurality of fourth data objects for the location.

In some example implementations of the method of any preceding example implementation, or any combination of preceding example implementations, performing the discrete event simulation of the process includes performing the discrete event simulation according to a user-selected one of at least three simulation modes, including a first simulation mode for generating the maintenance schedule, a second simulation mode for certifying the predefined maintenance schedule, and a third simulation mode for modifying the predefined maintenance schedule.

Some example implementations provide a computer system for supporting maintenance on a fleet of aircraft, the computer system comprising a processor and a memory storing executable instructions that, in response to execution by the processor, cause the computer system to at least: generate a computer model that describes a process performed by a system for in-service operation and maintenance of the fleet of aircraft, wherein the computer model comprises interconnected data objects and modules, the data objects describing at least the fleet of aircraft and a plurality of locations of the system available to perform maintenance on the fleet of aircraft, and the modules describing operations performed by the fleet of aircraft and the system, the data objects and the modules including at least: a first data object that includes aircraft attributes that describe aircraft of the fleet of aircraft; a second data object that includes location attributes that describe capacity of the plurality of locations to perform maintenance on aircraft of the fleet of aircraft; an in-service operation module that describes in-service operation of the fleet of aircraft, at least some of the aircraft attributes of the first data object being updateable based on the in-service operation of the fleet of aircraft; a location determination module that describes operation of the system to determine a location from the plurality of locations to perform maintenance on an aircraft of the fleet of aircraft based on the aircraft attributes of the first data object or a demand for maintenance from a predefined maintenance schedule, and based on the location attributes of the second data object; and a maintenance module that describes operation of the system to perform maintenance on the aircraft at the location; perform a discrete event simulation of the process, via the processor configured to access the computer model, to at least execute the modules including the in-service operation module, the location determination module and the maintenance module through a sequence of time-ordered discrete events; generate a maintenance schedule or certify the predefined maintenance schedule for the fleet of aircraft from the discrete event simulation of the process; and display the maintenance schedule or the predefined maintenance schedule to support maintenance performed on the fleet of aircraft by the system according thereto.

Some example implementations provide a computer-readable storage medium for supporting maintenance on a fleet of aircraft, the computer-readable storage medium being non-transitory and having computer-readable program code stored therein that in response to execution by a processor, causes a computer system to at least: generate a computer model that describes a process performed by a system for in-service operation and maintenance of the fleet of aircraft, wherein the computer model comprises interconnected data objects and modules, the data objects describing at least the fleet of aircraft and a plurality of locations of the system available to perform maintenance on the fleet of aircraft, and the modules describing operations performed by the fleet of aircraft and the system, the data objects and the modules including at least: a first data object that includes aircraft attributes that describe aircraft of the fleet of aircraft; a second data object that includes location attributes that describe capacity of the plurality of locations to perform maintenance on aircraft of the fleet of aircraft; an in-service operation module that describes in-service operation of the fleet of aircraft, at least some of the aircraft attributes of the first data object being updateable based on the in-service operation of the fleet of aircraft; a location determination module that describes operation of the system to determine a location from the plurality of locations to perform maintenance on an aircraft of the fleet of aircraft based on the aircraft attributes of the first data object or a demand for maintenance from a predefined maintenance schedule, and based on the location attributes of the second data object; and a maintenance module that describes operation of the system to perform maintenance on the aircraft at the location; perform a discrete event simulation of the process, via the processor configured to access the computer model, to at least execute the modules including the in-service operation module, the location determination module and the maintenance module through a sequence of time-ordered discrete events; generate a maintenance schedule or certify the predefined maintenance schedule for the fleet of aircraft from the discrete event simulation of the process; and display the maintenance schedule or the predefined maintenance schedule to support maintenance performed on the fleet of aircraft by the system according thereto.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
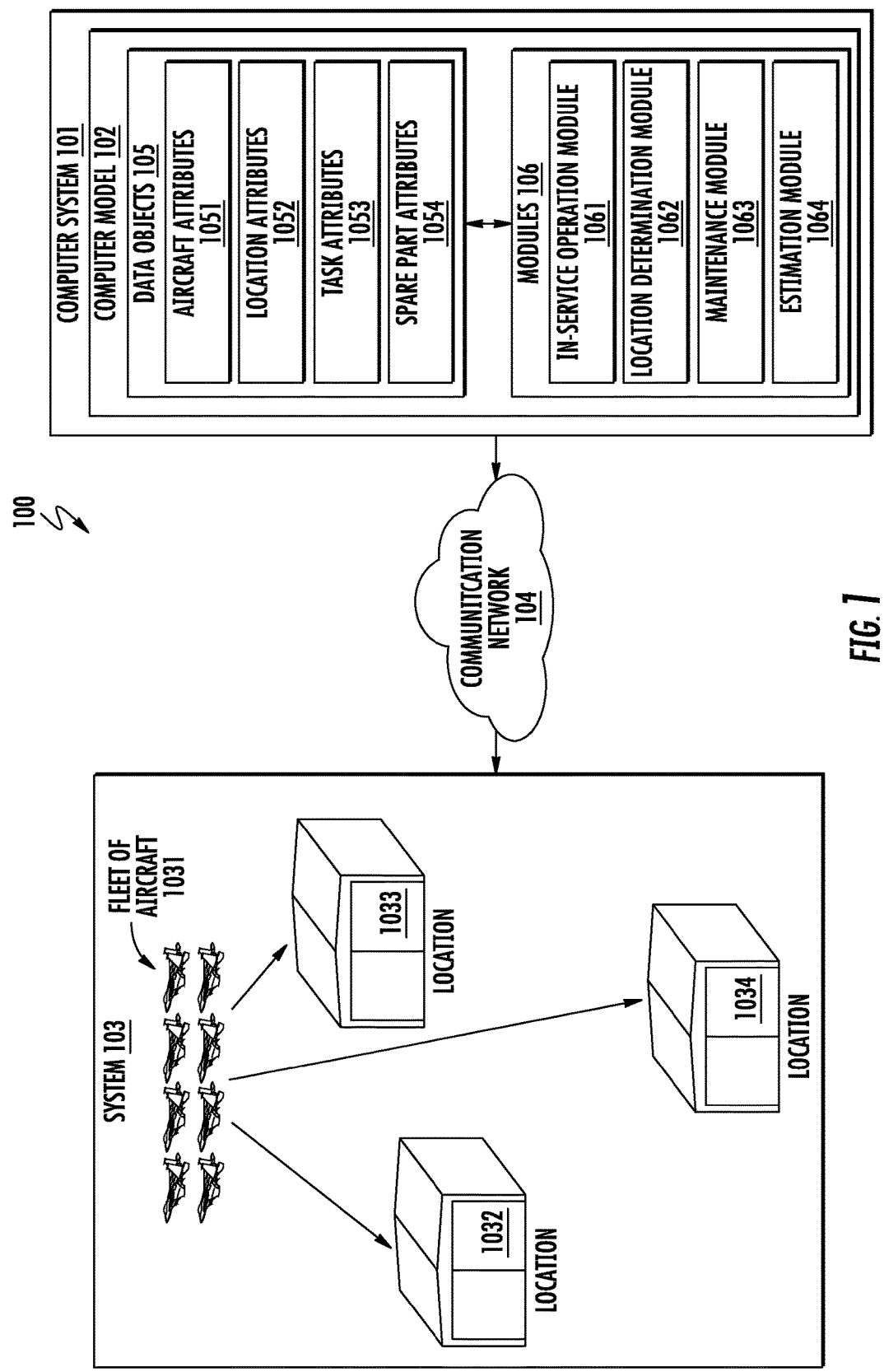
FIG. 1 illustrates a network for supporting and performing maintenance on a fleet of aircraft according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, referencing something as being a first, second or the like should not be construed to imply a particular order. Also, something described as being above something else may instead be below (unless otherwise indicated), and vice versa; and similarly, something described as being to the left of something else may instead be to the right, and vice versa. Like reference numerals refer to like elements throughout.

Example implementations of the present disclosure are generally directed to maintenance of a fleet of aircraft, in particular, to using discrete event simulation to support maintenance of a fleet of aircraft.

FIG. 1 illustrates a network 100 for supporting and performing maintenance on a fleet of aircraft according to example implementations of the present disclosure. In some examples, the network includes a computer system 101. The computer system includes a processor and a memory storing executable instructions that, in response to execution by the processor, cause the computer system to generate a computer model 102 that describes a process performed by a system 103 for in-service operation and maintenance of the fleet of aircraft. The system 103 may include a fleet of aircraft 1031 that include a plurality of aircraft. The system 103 may also include a plurality of locations, e.g., locations 1032-1034, for performing maintenance of the fleet of aircraft. For example, as shown, some aircraft of the fleet 1031 may be sent to the location 1032 for maintenance and other aircraft of the fleet may be sent to the location 1033 or the location 1034 for maintenance. The system 103 may further include airports, air traffic control towers, operation centers, technicians or facilities for in-service operation and maintenance of the fleet of aircraft (not shown in FIG. 1 for simplicity of illustration). In some examples, the system 103 includes the computer system 101.

In some examples, the computer system 101 is caused to implement the computer model 102 to generate a maintenance schedule or certify a predefined maintenance schedule for the fleet of aircraft 1031. The computer system 101 communicates the generated maintenance schedule or certified maintenance schedule to the system 103 such as via a communication network 104. The system 103 can perform maintenance on the fleet of aircraft 1031 according to the generated maintenance schedule or certified maintenance schedule from the computer system 101. Using the generated maintenance schedule or certified maintenance schedule, the system 103 can perform maintenance on the fleet of aircraft 1031 with reduced or minimized aircraft downtime during the maintenance, as compared to existing technologies.

In some examples, the computer model 102 includes interconnected data objects 105 and modules 106. In some examples, the computer model 102 includes computer-readable program code stored in the memory of the computer system 101.

The data objects 105 describe at least the fleet of aircraft 1031 and a plurality of locations, e.g., the locations 1032-1034, of the system 103 available to perform maintenance on the fleet of aircraft 1031. In some examples, the data objects 105 include at least a first data object 1051 that includes aircraft attributes that describe aircraft of the fleet of aircraft 1031, and a second data object 1052 that includes location attributes that describe capacity of the plurality of locations to perform maintenance on aircraft of the fleet of aircraft 1031.

The modules 106 describe operations performed by the fleet of aircraft 1031 and the system 103. In some examples, the modules 106 include at least an in-service operation module 1061 that describes in-service operation of the fleet of aircraft 1031. At least some of the aircraft attributes of the first data object 1051 are updateable based on the in-service operation of the fleet of aircraft 1031. The modules also include a location determination module 1062 that describes operation of the system 103 to determine a location from the plurality of locations, e.g., the locations 1032-1034, to perform maintenance on an aircraft of the fleet of aircraft 1031. In some examples, the determination of the location is based on the aircraft attributes of the first data object 1051 or a demand for maintenance from a predefined maintenance schedule, and based on the location attributes of the second data object 1052. The modules also include a maintenance module 1063 that describes operation of the system to perform maintenance on the aircraft at the location.

In some examples, the computer system 101 is caused to perform a discrete event simulation to simulate the process performed by the system 103 for in-service operation and maintenance of the fleet of aircraft. The simulation can be performed via the processor of the computer system configured to access the computer model 102, to at least execute the modules 106 including the in-service operation module 1061, the location determination module 1062 and the maintenance module 1063 through a sequence of time-ordered discrete events.

A discrete event simulation is characterized by the management of simulated time by an executive routine. Objects in such a model schedule their next event times with the executive. The state of the set of objects in such a model is changed with each event, and each event may cause a cascade of additional events to be scheduled. Discrete event simulations can be used to simulate systems that contain multiple asynchronous processes that interact and are constrained by resources that may be under contention. Each process may be modeled as a flow of items through a series of activities and queues. The flow of each process is controlled by logic that may depend on the current state of the system 103, the current attributes of the modelled objects 105, and the creation and destruction of items as they trigger events in the system.

The time-ordered discrete events may include in-service operation events such as take-off of the aircraft or landing of the aircraft. In some examples, the time-ordered discrete events include maintenance events such as inspection events to inspect aircraft parts of an aircraft of the fleet or modification events to repair, update or replace aircraft parts of an aircraft. In some examples, the discrete-event simulation simulates the process for in-service operation and maintenance of the fleet of aircraft 1031 as a discrete sequence of events in time. Each event occurs at a particular instant in time and the simulation can directly jump in time from one event to the next.

In some examples, the computer system 101 is caused to generate a maintenance schedule or certify the predefined maintenance schedule for the fleet of aircraft 1031 from the discrete event simulation of the process. The computer system is further caused to display the maintenance schedule or the predefined maintenance schedule to support maintenance performed on the fleet of aircraft by the system 103 according thereto. The system is configured to perform maintenance on the fleet of aircraft according to the maintenance schedule or the predefined maintenance schedule. Using the maintenance schedule or the predefined maintenance schedule, the system can perform maintenance on the fleet of aircraft 1031 with reduced or minimized aircraft downtime during the maintenance as compared to existing technologies.

In some examples, the computer system 101 is caused to perform the discrete event simulation to execute the in-service operation module 1061 and the maintenance module 1063. At least some of the aircraft attributes of the first data object 1051 are updated when executing the in-service operation module and the maintenance module. In some examples, the updated aircraft attributes include, for each aircraft of the fleet of aircraft, an age, a number of flight hours, an inspection status indicating past maintenance, or a current state indicating current in-service operation.

In some examples, the computer system 101 is caused to perform the discrete event simulation to execute the location determination module 1062 to determine the location from the plurality of locations to perform maintenance on the aircraft of the fleet of aircraft. In some examples, the determination of the location uses the second data object 1052 including the location attributes of the plurality of locations. In some examples, the location attributes include, for each location of the plurality of locations, a total capacity to perform maintenance, a current capacity to perform maintenance, or a work placement priority to accept a new maintenance task.

In some examples, the data objects 105 further include a plurality of third data objects 1053 that includes task attributes that describe a capability of the plurality of locations to perform maintenance tasks on aircraft of the fleet of aircraft 1031. Examples of suitable task attributes include, for each location of the plurality of locations, a baseline time to complete a maintenance task, a baseline priority of a maintenance task, or a priority of work-in-progress (WIP) adjustment. In these examples, computer system 101 is caused to perform the discrete event simulation to execute the location determination module to determine the location from the plurality of locations to perform maintenance on the aircraft of the fleet of aircraft 1031 further based on the task attributes of the plurality of third data objects.

In some examples, the modules 106 further include an estimation module 1064 that describes operation of the system 103 to estimate a difficulty to perform a maintenance task on the aircraft of the fleet of aircraft 1031 based on the aircraft attributes, the difficulty indicating required task attributes to perform the maintenance task on the aircraft. The computer system 101 is caused to perform the discrete event simulation to execute the estimation module 1064 to estimate the difficulty and thereby determine the required task attributes, and execute the location determination module to determine the location with task attributes matching the required task attributes to perform the maintenance task on the aircraft. For example, if a maintenance task needs to be finished within a predefined time period, the computer system execute the location determination module to determine the location with a baseline time equal or less than the predefined time period. In another example, if a location has a constraint for simultaneous difficult tasks in work at one time, in order to streamline production capability, the location determination module determines a location where such a constraint was not violated.

In some examples, the computer system 101 is caused to generate the maintenance schedule that satisfies predefined criteria including a time period that aircraft of the fleet of aircraft 1031 are out of service. For example, the computer system 101 is caused to generate the maintenance schedule such that the downtime of an aircraft of the fleet using the generated maintenance schedule is within a predefined time period. In another example, the computer system is caused to generate the maintenance schedule such that required aircraft maintenance events are conducted before due dates or thresholds are exceeded, while maximizing and/or improving the efficient use of available maintenance system capacity.

In some examples, the computer system 101 is caused to certify that the predefined maintenance schedule satisfies the predefined criteria. For example, the computer system 101 is caused to certify the predefined maintenance schedule to determine whether the downtime of an aircraft of the fleet using the predefined maintenance schedule is within a predefined time period. In another example, the computer system 101 is caused to certify the predefined maintenance schedule to determine that downtime of an aircraft due to maintenance system queue wait time is minimized or below a threshold level.

In some examples, the data objects 105 further include a plurality of fourth data objects 1054 that include spare part attributes that describe available spare parts (e.g., filters and valves) used at the plurality of locations to perform maintenance tasks on aircraft of the fleet of aircraft 1031. The computer system 101 is caused to perform the discrete event simulation to execute the maintenance module to perform maintenance on the aircraft at the determined location based on the spare part attributes of a respective one of the plurality of fourth data objects 1054 for the location. In some examples, the spare part attributes include, for each location of the plurality of locations, initial and current quantities of the spare parts or types of the spare parts.

In some examples, the computer system 101 is caused to perform the discrete event simulation according to a user-selected one of at least three simulation modes. Examples of suitable modes include a first simulation mode for generating the maintenance schedule, a second simulation mode for certifying the predefined maintenance schedule, and a third simulation mode for modifying the predefined maintenance schedule.

The selected mode can change how the discrete event simulation operates. For example, the first simulation mode can be referred to as "Fly Aircraft to Generate Schedule." In this mode, the discrete event simulation will simulate the actions (in-service operation) of the fleet and determine when inspections are due based on accrued aircraft attributes. In this way, the discrete event simulation can generate a maintenance schedule for the fleet. The second simulation mode can be referred to as "Generate Demand with Schedule." In this mode, the discrete event simulation will assess a predefined maintenance schedule for when each individual aircraft enters inspection. In this way, the discrete event simulation can certify a predefined maintenance schedule. The third simulation mode can be referred to as "Use Schedule, but Pull Early to Fill WIP." In this mode, the discrete event simulation simulates a predefined schedule as a suggestion. During the simulation, the discrete event simulation will pull in aircraft for maintenance before they would normally be due, subject to specified constraints, to efficiently utilize the available capacity of the locations.

Figure 2:
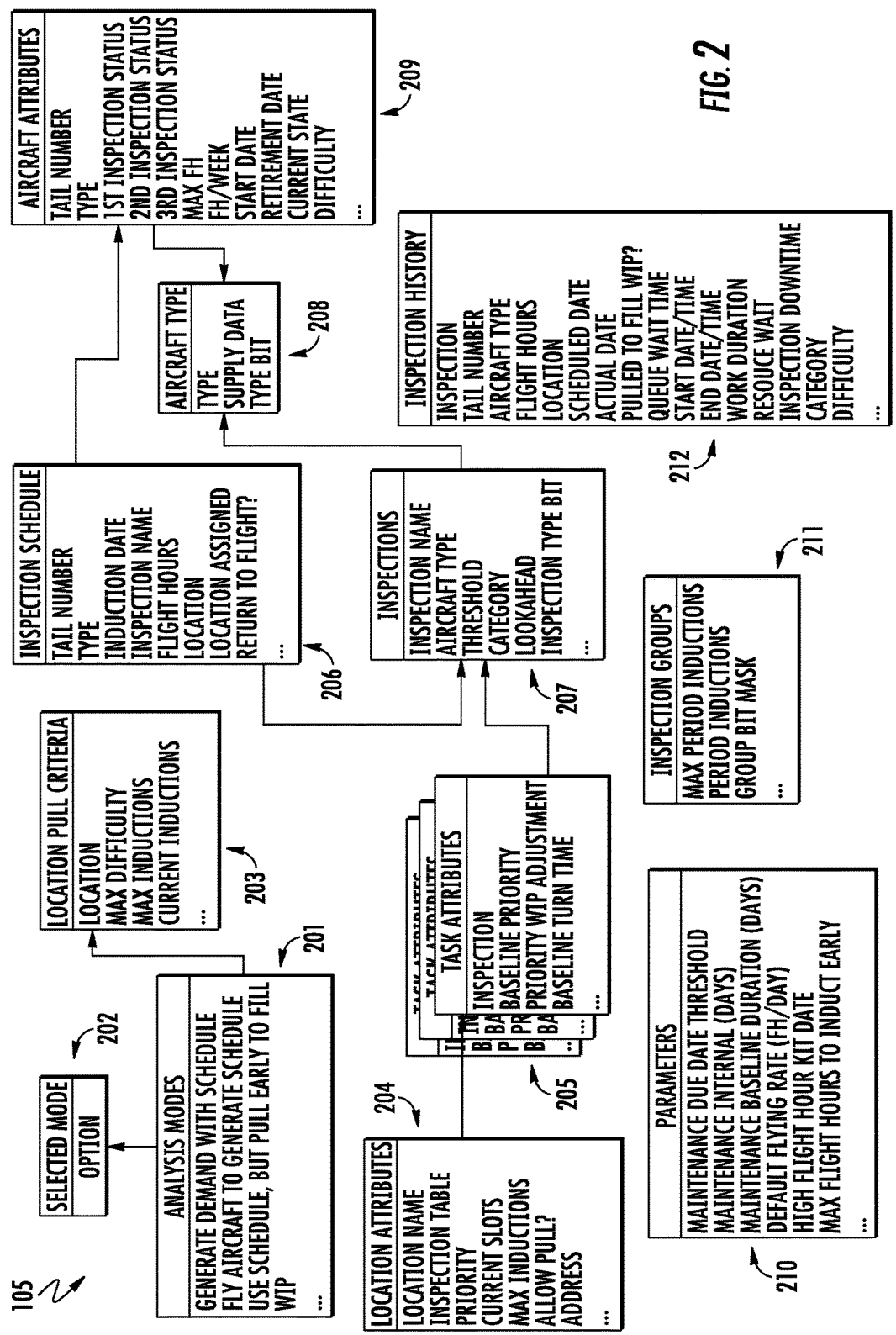
FIG. 2 illustrates data objects of a computer model for supporting maintenance on the fleet of aircraft, according to various example implementations.

FIG. 2 illustrates various data objects 105 according to example implementations. As shown, in some examples, the data objects include a data object 201 including an enumerated list of the three simulation or analysis modes as explained above, and a data object 202 including the current selection of the simulation mode to invoke the discrete event simulation. If the third mode "Use Schedule, but Pull Early to Fill WIP" is selected, the data objects also include a data object 203 indicating criteria for location selection (e.g., what kinds of aircraft or tasks can be sent to each location). The data object 203 may be used to assign aircraft or tasks to locations in the first or second mode as well, assuming they are not already specified by the user. In this way, location assignment is either dynamic (as the simulation runs) or for the purpose of plan evaluation. In some examples, the data object 203 is updated during the simulation and thus changes dynamically. The data object 203 can be used to characterize specific limits for handling maintenance tasks with various levels of difficulty at a specific site or location, and to track how many aircraft were currently in maintenance with various levels of difficulty at each location.

The data objects 105 may include a data object 204 including current location attributes that describe capacity of the plurality of locations available to perform maintenance on aircraft of the fleet of aircraft. Some location attributes include, for each location of the plurality of locations, a total capacity to perform maintenance, a current capacity to perform maintenance, a work placement priority to accept a new maintenance task, or whether or not a specific location is allowed to pull aircraft in early in the "Pull Early" simulation mode. In some examples, the data object 204 corresponds to the second data object 1052 described above with respect to FIG. 1.

Each record in the data object 204 may include current location attributes for one location. Each record in the data object 204 also includes a pointer to a unique data object 205 including task attributes at that location. Each of the data objects 205 includes data of task attributes of a single location. Some task attributes include, for each location of the plurality of locations, a baseline time to complete a maintenance task, a baseline priority of a maintenance task, or a priority of WIP adjustment. The task attributes of the single location indicate the capability of the location to perform maintenance tasks on aircraft of the fleet of aircraft. For example, a given maintenance task may take more or less time depending on which location is handling it. In some examples, the data objects 205 correspond to the third data objects 1053 described above with respect to FIG. 1.

The data objects 105 may include a data object 206 including a predefined maintenance or inspection schedule. For example, the module 106 may include an input table that describes a plan or inspection schedule for when specific inspection events are desired to start. In some examples, attributes in the data object 206 may affect simulated decisions in the computer model 102. In some examples, the data objects include a data object 207 including information about each type of inspection in the simulation. Different types of inspections may have unique attributes such as what types of aircraft they apply to or when they would be triggered based on aircraft attributes (e.g. threshold considerations such as flight hours). In some examples, the data objects include a data object 208 defining specific types of aircraft. The data object 208 may link to other data objects such as the data object 207 to further define what aircraft parts are required for a specific aircraft type.

The data objects 105 may include a data object 209 including aircraft attributes of each individual aircraft that is being evaluated or simulated. Some aircraft attributes include, for each aircraft of the fleet of aircraft, an age, a number of flight hours, an inspection status indicating past maintenance, or a current state indicating current in-service operation. In some examples, some aircraft attributes (e.g., start date) of each aircraft may be static as the simulation runs. In some examples, some aircraft attributes (e.g., current state and inspection status) of each aircraft can be dynamically updated as the simulation runs based on the time-ordered discrete events occurred in the simulation. In some examples, the data object 209 corresponds to the first data object 1051 described above with respect to FIG. 1. The data object 207 may be also related to the data object 209 via the data object 208, which allows the first simulation mode to generate events. Both the data objects 206 and 209 may reference the data object 207.

The data objects 105 may include a data object 210 including global parameters that apply to all locations or which govern global model behavior as scenario or policy inputs. In some examples, the data objects include a data object 211 defining sets or groups of inspections to allow logic or metrics in the simulation to apply to sets of inspections. In some examples, the data objects include a data object 212 including a log history file that includes information about the simulated events in the computer model 102. The data collected in the log history file is used to aggregate performance metrics that indicate the feasibility of the plan or scenario being tested by the simulation.

Figure 3:
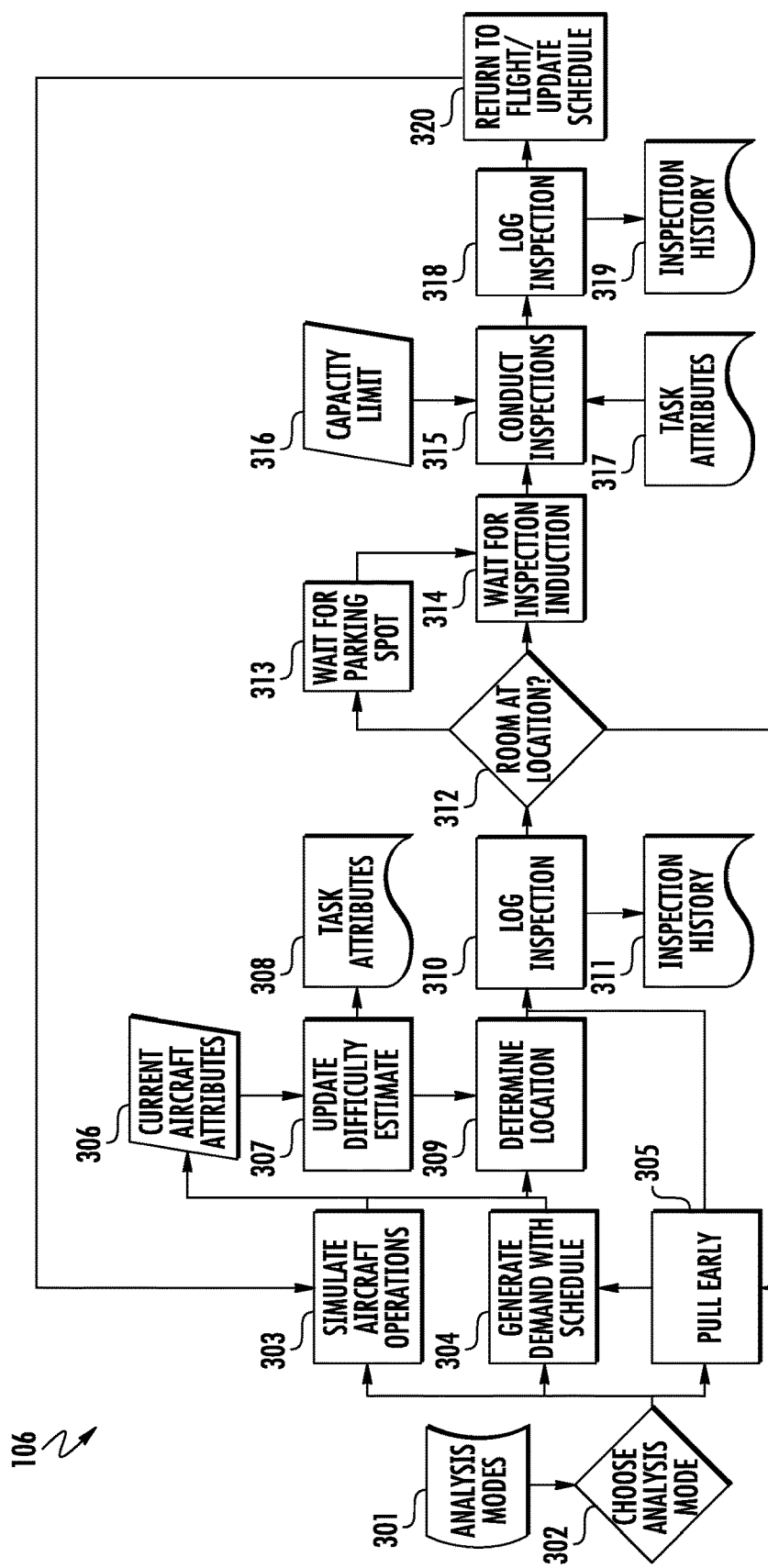
FIG. 3 illustrates modules of the computer model for supporting maintenance on the fleet of aircraft, according to various example implementations.

FIG. 3 illustrates various modules 106 and some data objects according to example implementations. As shown, multiple modules and multiple data objects are interconnected to form a flowchart that is executed in the discrete event simulation.

In some examples, the module 301 is connected to the data object 201 to provide the user options of simulation modes to invoke the discrete event simulation. The module 302 is provided for the user to select a simulation mode from the module 301 to support the user's decision objectives, e.g., generating a maintenance schedule or certifying a predefined maintenance schedule.

In some examples, after the user selects a simulation mode at the module 302, the discrete event simulation is invoked and starts from one of modules 303-305. The in-service operation module 303 describes in-service operation of the fleet of aircraft. In some examples, the module 303 is invoked by the "Fly Aircraft to Generate Schedule" mode selected by the user.

The module 303 may include a flow of logic that simulates in-service operation of the fleet. Aircraft items are generated to reflect each individual tail in the fleet. These items flow through a process where they accrue attribute values as a function of simulated time (e.g., flight hours, age, landings, traps, catapults, number of outstanding maintenance actions, etc.). Aircraft may have entry or retirement dates such that the simulation invokes an aircraft item instance when aircraft enter the scenario and removes that instance when the aircraft item reaches its retirement date. The module 303 may also include logic to send the aircraft item into inspection or modification when it reaches a criterion based on its aircraft attributes. For example, an aircraft may have exceeded a flight hour threshold, thus, the aircraft is due for inspection or modification and is passed downstream to the flowchart that schedules the maintenance task at a location. In some examples, the in-service operation module 303 corresponds to the in-service operation module 1061 described above with respect to FIG. 1.

In some examples, the module 304 is invoked by the "Generate Demand with Schedule" simulation mode. The module 304 generates an item that represents a specific inspection or modification request at a specified date (i.e., a predefined maintenance schedule). The specific request may have attributes including a specific tail number, aircraft type, due date, name, or desired location to do the work. The desired location may also be dynamically determined as the simulation runs. The module 304 may also include a flag to indicate if additional future inspections should be scheduled upon completion of this request or not. The request is then passed downstream to the flowchart that schedules the maintenance task to according to the request.

In some examples, the module 305 is invoked by the "Use Schedule, but Pull Early to Fill WIP" simulation mode. The module 305 invokes the module 304, but also adds a capability to respond to a message from the downstream of the simulation. Specifically, when there is capacity at a location where modifications are being done, a signal is passed to the module 305 (e.g., from the module 312 as described below) that causes it to review the current schedule to seek aircraft items to send to the location for maintenance. An aircraft item can be selected according to a criterion (e.g., the aircraft item closest to the location that has either requested the location or can be sent to any location).

In some examples, after the simulation starts from one of the modules 303-305, the simulation proceeds to module 306. The module 306 dynamically updates the aircraft attributes of the fleet of aircraft as simulated events occur that involve the aircraft of the fleet. The module 306 also stores the updated aircraft attributes to the data object 209.

In some examples, an estimation module 307 uses the current aircraft attributes updated and stored at the module 306 to derive or estimate a difficulty score that will be used to allocate a maintenance task to the best facility or location. For example, the difficulty score is higher if an aircraft requesting maintenance has accrued more flight hours or is of a particular type. In some examples, the module 307 also updates and stores the task attributes (e.g., what capability the facility or location should have to perform the maintenance task) in a file 308 (corresponding to the data objects 205) based on the difficulty score. In some examples, the estimation module 307 corresponds to the estimation module 1064 described above with respect to FIG. 1.

In some examples, the simulation keeps tracking the current task attributes of the locations, which may vary depending on current aircraft attributes or over time. Examples of the task attributes include "Baseline Turn Time", which is the baseline time to complete a maintenance task. The "Baseline Turn Time" may be random, or may vary depending on other task attributes. For example, the "Baseline Turn Time" can be multiplied by the difficulty score to inflate or reduce the baseline time to complete the maintenance task. Or, it may change over time as learning curves or completed standard kits are developed. The current task attributes of the locations are stored in the file 308.

In some examples, a location determination module 309 considers the current aircraft attributes of an aircraft of the fleet (from the data object 209) or a demand for maintenance from a predefined maintenance schedule (from the data object 206) and also considers the location attributes (from the data object 204), the task attributes (from the data objects 205) or the criteria for location selection (from the data object 203) to determine where to send the aircraft item for maintenance. For example, for an aircraft that has exceeded a flight hour threshold, the module determines the location that is closest to the aircraft and has the capacity and the capability to perform the maintenance. In some examples, the module models a behavior where difficult maintenance tasks need to go to a specific location, or in order to better control maintenance flow, at any one time, a specific location can only handle a limited number of aircraft with difficult maintenance tasks. In some examples, the location determination module 309 corresponds to the location determination module 1062 described above with respect to FIG. 1.

In some examples, at module 310, all actions that pertain to a specific inspection are logged in a history file 311 (corresponding to the data object 212). At this point in the simulation, the logged data in the history file includes the simulated date the inspection was inducted into the simulation or the location where it was sent.

In some examples, module 312 is responsible for notifying the upstream "Pull Early" module (the module 305) that capacity has opened up at a location. In some examples, the module 312 is triggered in two ways: 1) when an aircraft item that was undergoing inspection leaves that activity, and there are no aircraft items in the queue of aircraft items waiting to start the inspection work flow in the simulation of that location; or 2) as a function of period checks for free capacity at the locations. The trigger passed to the "Pull Early" module has a value that indicates which location has the free capacity.

In some examples, module 313 provides an optional additional queue for aircraft items. If the user desires to model limited aircraft ramp space at a location, the module will record any instances where a location would have exceeded its ramp space due to wait for maintenance space caused by excessive maintenance demand rates.

In some examples, module 314 includes a queue that holds any aircraft items that cannot immediately start their inspection work flow due to capacity constraints at the corresponding location.

In some examples, a maintenance module 315 includes a modeled functional flow that represents the execution of the maintenance tasks performed on the aircraft (e.g., modification or inspection). The behavior of this module is governed by location attributes of the determined location including maximum capacity of the determined location stored in a file 316 (corresponding to the data object 204), and by task attributes of the task stored in a file 317 (corresponding to the data objects 205). In some examples, the maintenance module 315 corresponds to the maintenance module 1063 described above with respect to FIG. 1.

In some examples, at module 318, the task is completed and information is logged by the module such as any wait for capacity, start and end dates or times, total aircraft downtime. The logged data is stored in a history file 319 (corresponding to the data object 212).

In some examples, module 320 schedules a future maintenance event for some aircraft items depending on task attributes of the task that was just processed or other parameters. For example, the global parameter "High Flight Hour Kit Date" (in the data object 210) may define logic where after this date additional work is not required, but before this date another inspection must be scheduled. After the future maintenance event is scheduled, the simulation may proceed from the module 320 back to the module 303 to start the simulation again.

In some examples, during the maintenance, some aircraft parts of the aircraft are repaired, modified, updated or replaced using available spare parts at the location. Thus, it is desired for the user to know the likelihood that the required spare parts are available at the location. For example, an aircraft may come into a modification event to get a radar upgrade. The original radar is removed from the aircraft to enter a repair or upgrade process which takes some number of days and is subject to randomness and variability. When the radar is upgraded it is placed back into inventory with a different part number for use in the modification process.

It is desired to know how many initial upgraded parts the location must have on hand at the start such that the upgrade process can keep up with the planned aircraft modification rate. It is also desired to know, given the current fleet mix, how fast the aircraft can be sent to different locations for modifications without affecting maintenance that is already scheduled or causing too large a percentage of the fleet to be down. If spare parts are not available to complete modification tasks on time, both fleet readiness and the already planned scheduled events may be impacted.

In some examples, the data objects 105 further include a plurality of fourth data objects that include spare part attributes that describe available spare parts (e.g., filters and valves) used at the plurality of locations to perform maintenance tasks on aircraft of the fleet of aircraft. The computer system 101 is caused to perform the discrete event simulation to execute the maintenance module to perform maintenance on the aircraft at the determined location based on the spare part attributes of a respective one of the plurality of fourth data objects for the location. For example, the computer system executes the maintenance module to perform maintenance based on the quantity of the spare parts at the location. In some examples, the computer system is caused to perform the discrete event simulation to execute the location determination module to determine the location considering current inventory of required spare parts at each location. For example, the computer system executes the location determination module to determine the location with the required spare parts to perform the maintenance.

Figure 4:
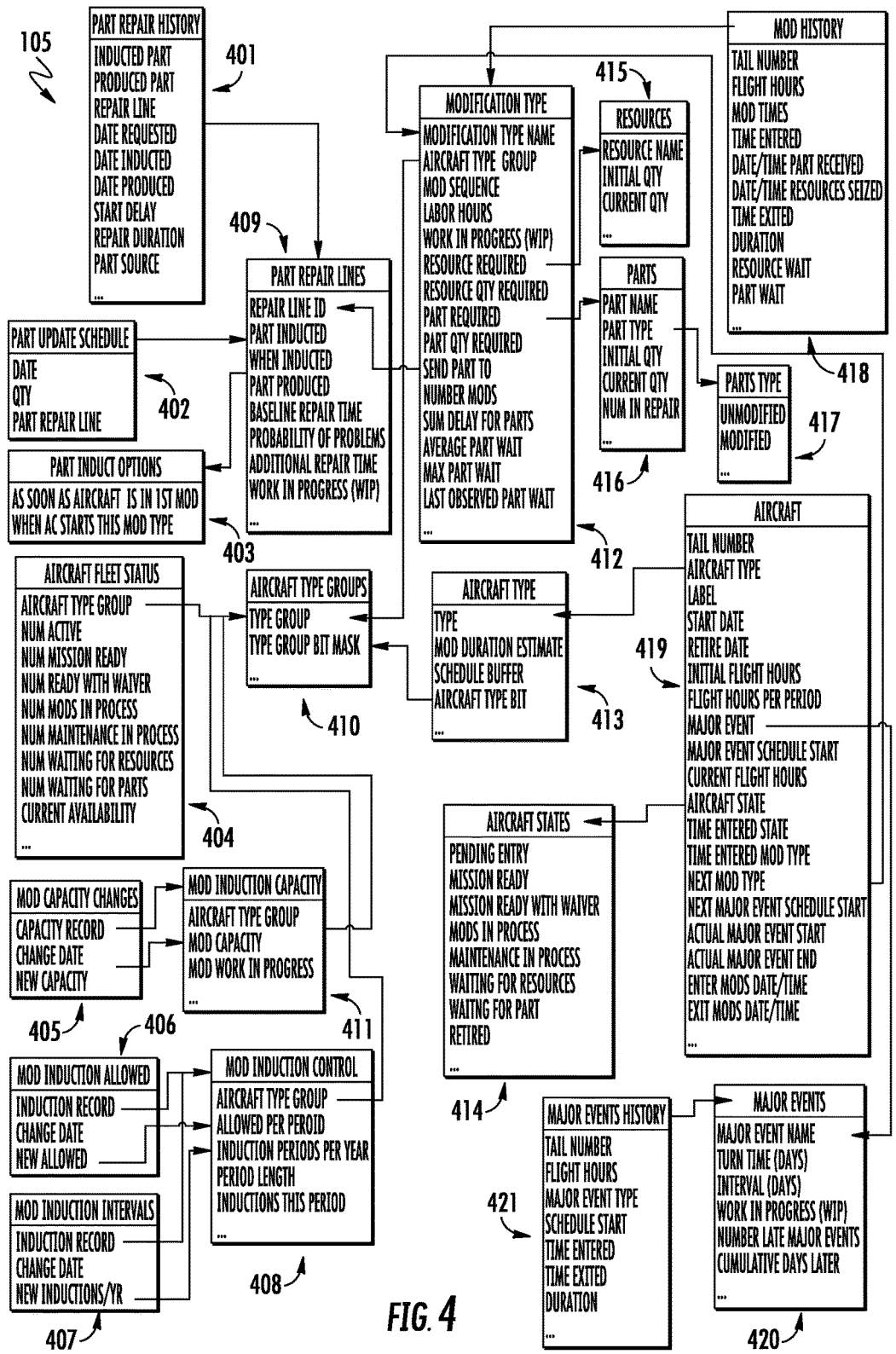
FIG. 4 illustrates data objects of the computer model including spare part attributes, according to various example implementations.

FIG. 4 illustrates various data objects 105 including spare part attributes, according to example implementations. In some examples, the data objects 105 include the data objects shown in FIG. 4 and some or all data objects shown in FIG. 2 (the data objects shown in FIG. 2 are omitted in FIG. 4 for simplicity of illustration).

As shown in FIG. 4, in some examples, the data objects 105 include a data object 401 including information of events associated with the modeled part repair or update processes. In some examples, the data objects 105 may include an optional data object 402 including a plan describing when a pro-active planned repair process may be invoked to provide a supply of upgraded seed spares in time for modification activities. In some examples, the data objects 105 include a data object 403 including part induct options used to select logic in the simulation to decide if parts in a multi-step process should all be removed from an aircraft immediately upon induction of the aircraft or if they should only be removed when their associated sequential modification step occurs. The data object 403 may affect the timing of when the repair or update process gets invoked for each part of each aircraft in the fleet.

The data objects 105 may include a data object 404 including the state of each aircraft in the modeled fleet. The data object 404 can be used to derive fleet availability metrics. In some examples, the data objects 105 include a data object 405 including information of modification capacity changes. The data object 405 can be used to define how the capacity constraints change over time. For example, one location may have space for twenty aircraft this year, but the location may have space for thirty aircraft next year.

The data objects 105 may include a data object 406 including information of allowed modification inductions. The data object 406 can be used to define changing of constraints over time for how many modifications are allowed during a modeled period. For example, this year one location may allow aircraft to arrive for maintenance no faster than two aircraft per month, but next year the location may allow three aircraft per month. In some examples, the data objects 105 include a data object 407 including information of modification induction intervals. The data object 407 can be used to define the interval corresponding to the allowed modification inductions in the data object 406. For example, the interval can be twelve inductions per year or one induction every month.

The data objects 105 may include a data object 408 including information of modification induction control. The data object includes the current information used to decide if there is room for an aircraft to be inducted into modification given the constraints of the location. In some examples, the data object 408 can be included in the data object 204 in FIG. 2.

The data objects 105 may include a data object 409 including information of part repair lines. The data object describes individual part repair operations. A part repair line is an object capable of transforming one specific part into another. For example, a part repair line may transform part A-1 to part A-2 configuration, or transform part A into part B. The repair process refers to attributes in the data object such as "Baseline Repair Time." The data object also includes current repair line metrics such as current WIP, which a user may use to determine a required facility to support the modification process.

The data objects 105 may include a data object 410 including information of aircraft type groups. The data object 410 allows the user to define sets of aircraft types for use in decision logic that applies to the set. A set may include one or more aircraft types. In some examples, the data objects 105 include a data object 411 including information of modification induction capacity. The data object 411 allows for total WIP to be constrained for sets of aircraft types if desired. For example, the data object 411 can be used to control how many groups of each aircraft type are allowed to be in maintenance at any one time.

The data objects 105 may include a data object 412 including information of modification types. The data object specifies what types of modifications are in the scenario and what their attributes are. For example, a modification type may pertain to only aircraft of a certain type, and may be comprised of a set of steps that may occur in a sequence or in parallel. Each specified step is a record in a modification types table. Each step may have further attributes such as required labor hours, labor types and quantities, parts, part quantities, and an associated repair line that a removed part should be sent to. There are also runtime output fields in this data object which record metrics for each step such as delay to accomplish the step, current number of aircraft performing this step. This data object is related to the data object 207 in FIG. 2.

The data objects 105 may include a data object 413 including information of aircraft types. The data object 413 can be included in the data object 208 in FIG. 2. In some examples, the data objects 105 include a data object 414 including information of aircraft states. The data object 414 specifies the allowed states of aircraft in the simulation.

The data objects 105 may include a data object 415 including information of resources. The data object includes data to specify the types and quantities of labor resources that may be used in a scenario. The data object also tracks the current state and quantity in use for each specified resource.

The data objects 105 may include a data object 416 including information of aircraft parts. The data object contains data to specify the types and quantities of aircraft parts that may be used in a scenario. Each aircraft part may be described in terms of attributes such as name, type, initial quantity, current quantity on shelf, number of current back- orders, or number of parts in repair. In some examples, the data objects 105 include a plurality of data objects 416 for the plurality of locations. The data objects 416 include spare part attributes that describe available spare parts used at the plurality of locations to perform maintenance tasks on aircraft of the fleet of aircraft. Each data object 416 may include spare part attributes for one location. In some examples, the spare part attributes include, for each location of the plurality of locations, initial and current quantities of the spare parts or types of the spare parts. In some examples, the plurality of data objects 416 correspond to the plurality of fourth data objects 105d described above with respect to FIG. 1.

The data objects 105 may include a data object 417 including information of part types. This data object enumerates categories of aircraft parts in the scenario. For example, parts may be categorized as unmodified, modified or upgraded. This information can be used for reporting to the user.

The data objects 105 may include a data object 418 including information of modification history. This data object includes a history of every simulated modification step that occurs for each aircraft in the scenario. The data object is used to aggregate performance metrics that indicate the feasibility of the plan or schedule or scenario being tested by the simulation.

The data objects 105 may include a data object 419 including information of aircraft of the fleet. This data object specifies all individual aircraft that are in the scenario and their attributes. This data object may include static characteristics or attributes that change dynamically as the simulation runs. In some examples, the data object 419 can be included in the data object 209 in FIG. 2.

The data objects 105 may include a data object 420 including information of major events such as a major inspection. This data object describes maintenance events that are already planned or scheduled for an aircraft which the plan or schedule under evaluation must avoid conflicts with. In some examples, the simulation contains logic using this data object to avoid inducting aircraft into modification that are due for a major maintenance event (which is generally handled by another business entity). The simulation also contains logic to simulate these major events such that aircraft become available for induction into modification at the correct time.

The data objects 105 may include a data object 421 including information of major events history. This data object contains a history of every simulated major event that occurs for each aircraft in the scenario. This data object is used to verify that aircraft are available for their scheduled off-site maintenance events when they are due.

Figure 5A:
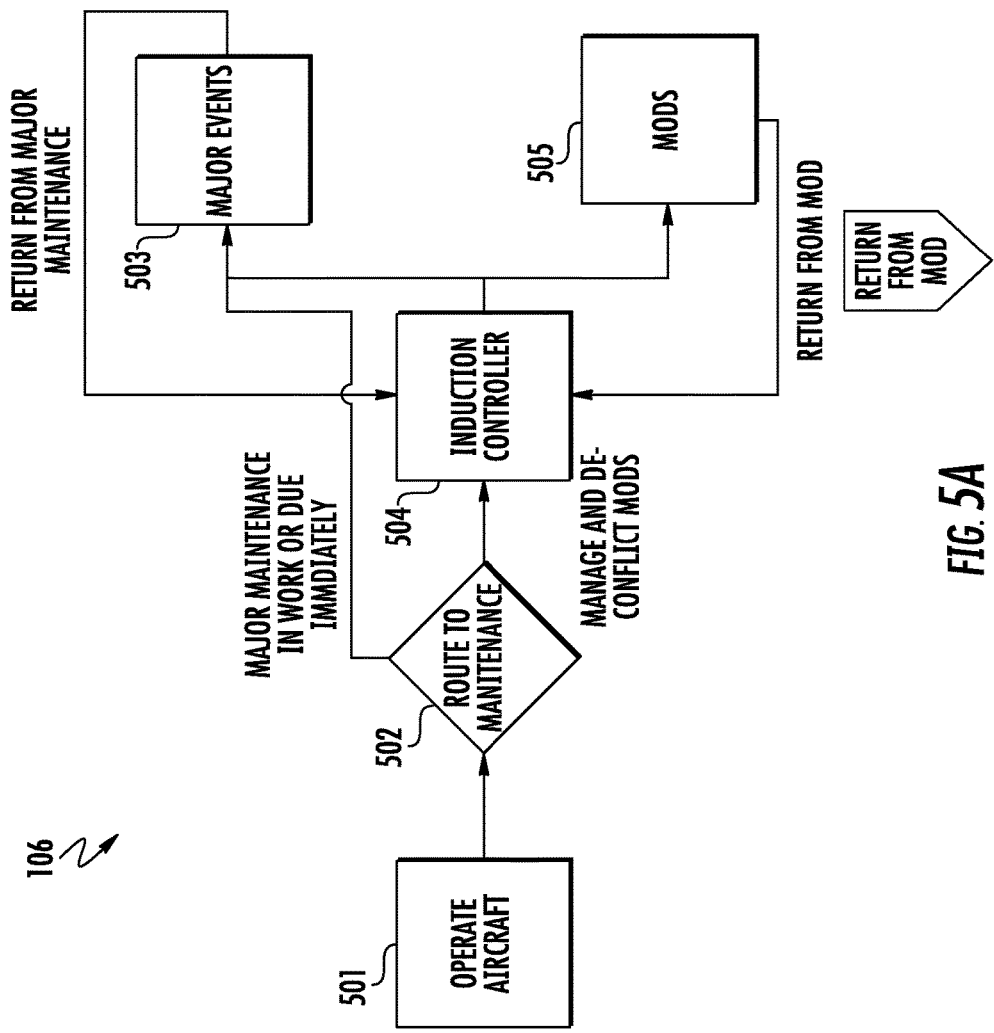
FIGS. 5A, 5B and 5C illustrate modules of the computer model for supporting maintenance on the fleet of aircraft based on available spare parts, according to various example implementations.
Figure 5B:
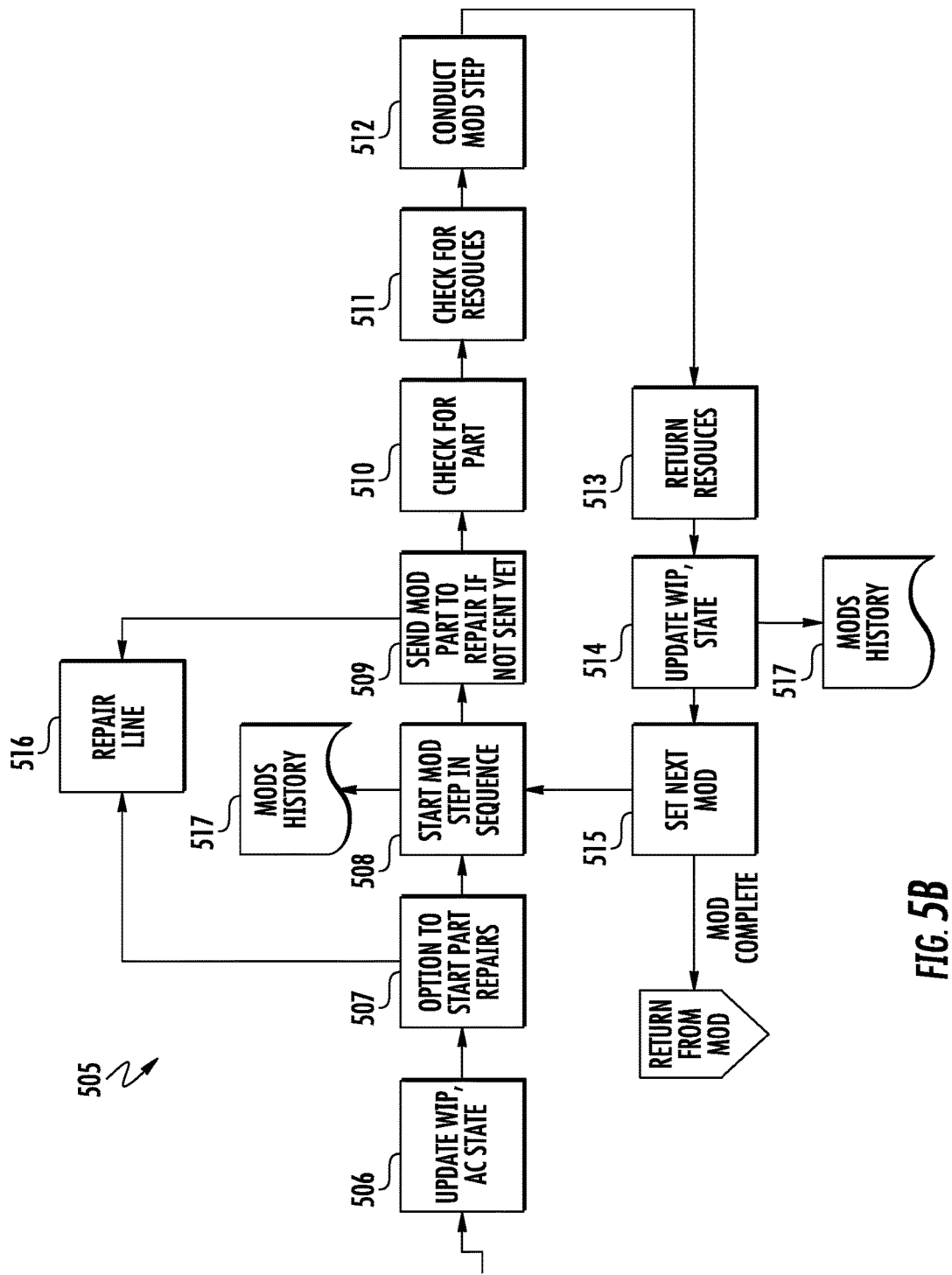
Figure 5C:
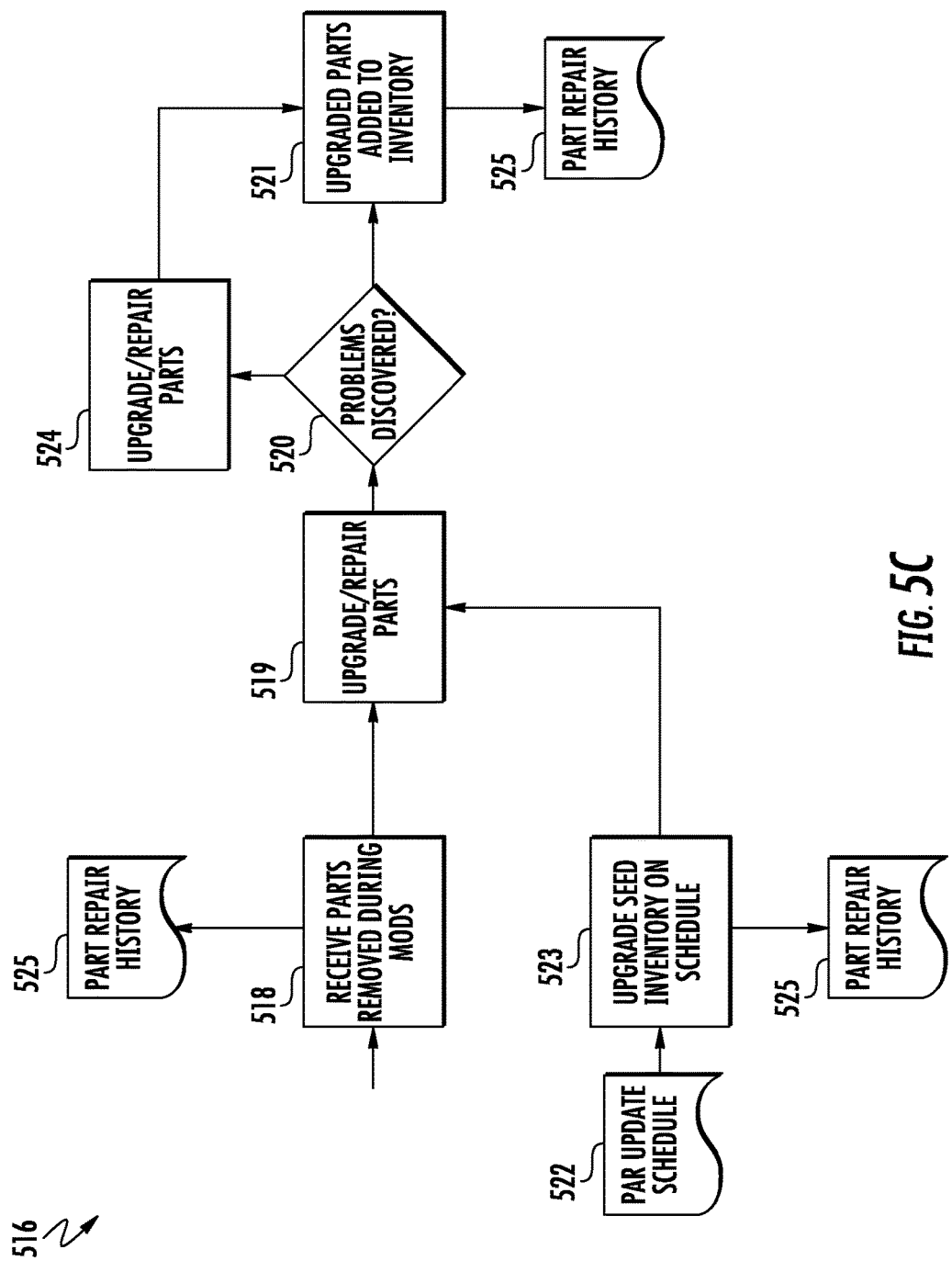

In some examples, the computer system 101 is caused to execute the maintenance module to perform maintenance on the aircraft at the determined location based on the spare part attributes of a respective one of the plurality of fourth data objects for the location. In these examples, the modules 106 include additional modules to support maintenance based on the spare part attributes. FIGS. 5A, 5B and 5C illustrate modules 106 for support maintenance on the fleet of aircraft based on available spare parts, according to various example implementations. As shown, multiple modules and multiple data objects are interconnected to form a flowchart that is executed in the discrete event simulation. In some examples, the data modules 106 include the modules shown in FIGS. 5A, 5B and 5C and some or all modules shown in FIG. 3 (the modules shown in FIG. 3 are omitted in FIGS. 5A, 5B and 5C for simplicity of illustration).

Specifically, as shown in FIG. 5A, in some examples, the module 501 contains a flow of logic that simulates fleet operations. This module is analogous to the module 303. The purpose of this module is to determine when aircraft reach criteria that trigger a need for a modification based on their attributes (from the data object 419) that change over time.

In some examples, module 502 determines the route to maintenance by considering if aircraft are due for periodic major events such as a major inspection. If aircraft are under a major maintenance event or the major maintenance event is due immediately, the aircraft are not eligible for induction into the modification process and the simulation proceeds from the module 502 to module 503. Otherwise, the simulation proceeds from the module 502 to module 504 (induction controller). The module 502 uses data objects 413, 419 and 420.

In some examples, the module 503 models the major event duration for the purpose of taking aircraft out of consideration for induction into modification. When a major event is completed for the aircraft, the aircraft are then eligible for induction and return to the module 504. The module 503 uses the data object 420, changes aircraft state in the data object 419 according to definitions in the data object 414, and records data in the data object 421.

In some examples, the module 504 chooses the best aircraft to route into the next modification subject to constraints. Specifically, the module 504 attempts to schedule aircraft such that any modification tasks do not interfere with a major event. The module 504 also considers modification capacity restrictions and uses the data objects 406, 407, 408, 10, 413 and 419. In some examples, the module 504 is included in the module 309.

In some examples, module 505 is similar to the module 315 with the addition of enhanced detail for the modification process. After the modification process is implemented by the module 505, the simulation returns to the module 504 for the next induction. In the module 505, each modification event is broken down into tasks (or "modification steps") as defined in the data object 412. Each modification step defines labor effort, required labor resources, and any parts that are required for completion of the step. Additionally, the modification steps may require that an aircraft part be removed from an aircraft for upgrade or repair. In some examples, the module 505 is decomposed into multiple modules forming a flowchart that describes a modification process as shown in FIG. 5B.

As shown in FIG. 5B, in some examples, module 506 is invoked to log the start of the modification process once an aircraft is inducted into a modification. The module 506 adjusts current aircraft state information and records current WIP using the data objects 408, 411, 412, 414 and 419. This module is similar to the module 310.

In some examples, module 507 provides the option to start part repairs. The module contains the option to remove all parts requiring removal at the module and upgrade or repair the parts at the start of the modification process. The module uses the data objects 403 and 409 to provide the option and uses the data object 412 to identify all modification steps in the modification process and their associated parts requiring removal.

In some examples, module 508 keeps tracking the current modification process in a sequence of steps which may occur either in parallel or sequentially, and logs each event as it occurs. This module references the data objects 412 and 419. The log of events is stored in a history file 517 (corresponding to the data object 418).

In some examples, if a decision was made to defer removal of an aircraft part needing update or repair until its specific modification step occurs, the part is removed at module 509 (not removed at module 507) and sent to a repair line function module 516. The module uses the data objects 403 and 409 to make the decision and uses the data object 412 to identify parts requiring removal for this modification step.

In some examples, module 510 examines the current state of inventory (from data object 416) to determine if the correct version of the required part (from the data object 412) is available. If not, the modification step must wait until the correct part is available. In some examples, module 511 examines the current state of labor resources (from the data object 415) to determine if the required quantity of the parts (from the data object 412) is available. If the required quantity is not available, the modification step is delayed and will accrue additional wait time.

In some examples, module 512 models the time for each modification step to complete as a function of labor effort, labor resources, and labor shifts. Multiple modification steps may be underway at a time depending on the modification induction process and scenario constraints. The module references the data object 412.

In some examples, module 513 returns labor resources for future use of other modification steps once a modification step is complete. The module 513 uses the data objects 412 and 415. In some examples, after an aircraft completes a modification step, module 514 is invoked to log the modification process, adjust current aircraft state information, and record or update current WIP into the history file 517. The module 514 uses the data objects 412, 414, 418 and 419 and is similar to the module 318. In some examples, module 515 determines which step or steps are next for each modification. The module 515 references the data objects 412 and 419 and logs information in the data object 418. Then the modification process is finished.

In some examples, in the modification process, when an aircraft part is removed from an aircraft during modification at modules 507 or 509, the repair line function module 516 is invoked to repair or update the part. The module 516 interacts with the data object 409. In some examples, the module 516 is decomposed into multiple modules forming a flowchart that describes a repair line process as shown in FIG. 5C.

As shown in FIG. 5C, in some examples, module 518 receives parts removed during the modification process. When a part is removed during a modification step, the repair line process starts from the module. The module updates a part repair history log file 525 (corresponding to the data object 401).

In some examples, module 519 models the process of upgrade or repair to transform a part from one type to another (e.g., broken to repaired, one configuration to another) over a time period. This module interacts with the data object 409. The number of parts in repair is incremented in the data object 416 when executing the module 519.

In some examples, module 520 accounts for the possibility that unanticipated problems were discovered during the upgrade or repair operation at the module 519, based on a probability of problems contained in the data object 409. If an unanticipated problem is discovered, the aircraft part is routed to an additional upgrade or repair module 524. The module 524 models additional work that may be needed to update or repair parts based on the probabilistic discovery of additional tasks at the module 520 and interacts with the data object 409.

In some examples, module 521 accounts for the addition of an upgraded or repaired part into inventory using the data object 416, when the upgrade or repair process is completed. This module also updates the repair process event history in the part repair history log file 525. The number of parts in repair is decremented in the data object 416 when executing the module because upgraded or repaired parts are added into inventory.

In some examples, module 523 provides an optional process for modeling a plan or schedule to proactively transform parts into their updated versions. The module uses a part update schedule 522 (corresponding to the data object 402) and updates the part repair history log file 525. The module 523 uses the data objects 401, 402 and 409. If the optional process at the module 523 is invoked, the repair line process proceeds to the module 519 for updating the parts.

Figure 6:
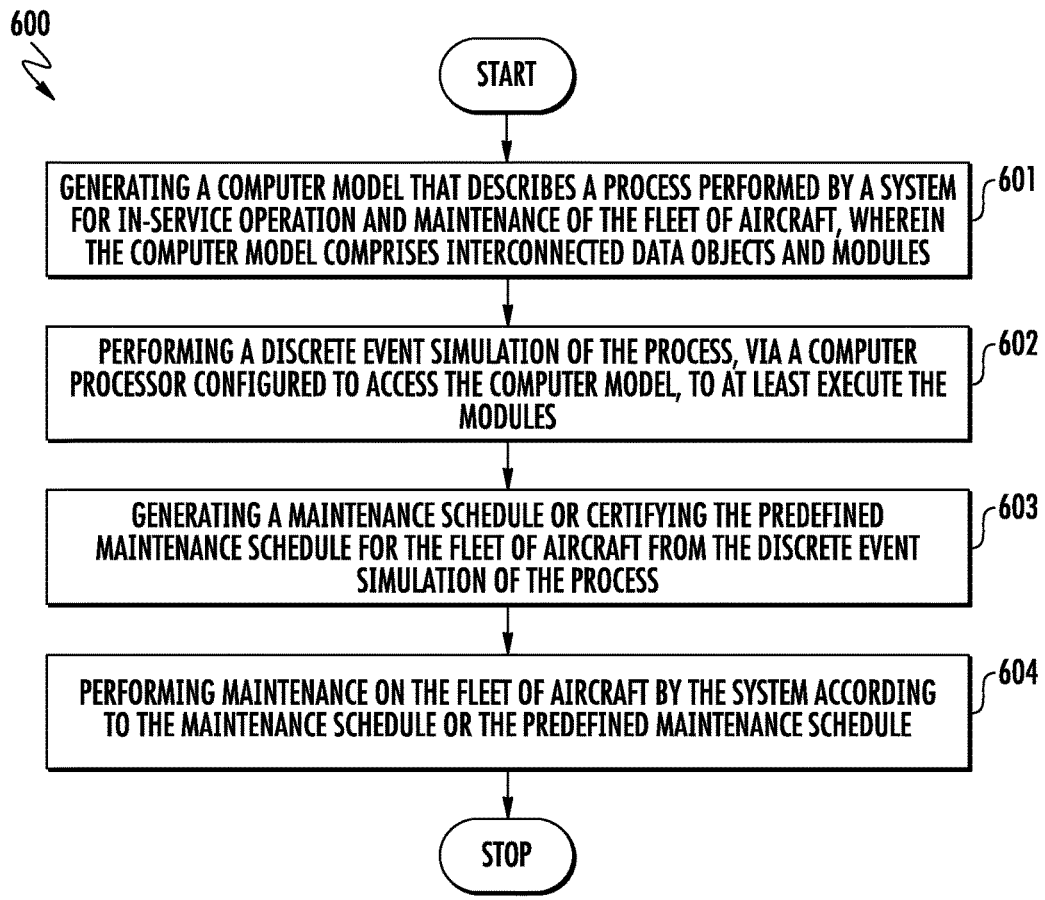
FIG. 6 is a flowchart illustrating various steps in a method of supporting and performing maintenance on the fleet of aircraft, according to various example implementations.

FIG. 6 is a flowchart illustrating various steps in a method 600 of supporting and performing maintenance on the fleet of aircraft, according to various example implementations. As shown, at block 601, the method 600 includes generating a computer model 102 that describes a process performed by a system 103 for in-service operation and maintenance of the fleet of aircraft.

The computer model 102 includes interconnected data objects 105 and modules 106. The data objects describe at least the fleet of aircraft and a plurality of locations of the system available to perform maintenance on the fleet of aircraft. The modules describe operations performed by the fleet of aircraft and the system.

The data objects 105 include at least a first data object 209 that includes aircraft attributes that describe aircraft of the fleet of aircraft and a second data object 204 that includes location attributes that describe capacity of the plurality of locations to perform maintenance on aircraft of the fleet of aircraft.

The modules 106 include at least an in-service operation module 303 that describes in-service operation of the fleet of aircraft, at least some of the aircraft attributes of the first data object being updateable based on the in-service operation of the fleet of aircraft. The modules also include a location determination module 309 that describes operation of the system to determine a location from the plurality of locations to perform maintenance on an aircraft of the fleet of aircraft based on the aircraft attributes of the first data object or a demand for maintenance from a predefined maintenance schedule, and based on the location attributes of the second data object. The modules further include a maintenance module 315 that describes operation of the system to perform maintenance on the aircraft at the location.

At block 602, the method 600 includes performing a discrete event simulation of the process, via a computer processor configured to access the computer model 102, to at least execute the modules including the in-service operation module 303, the location determination module 309 and the maintenance module 315 through a sequence of time-ordered discrete events.

At block 603, the method 600 also includes generating a maintenance schedule or certifying the predefined maintenance schedule for the fleet of aircraft from the discrete event simulation of the process. At block 604, the method further includes performing maintenance on the fleet of aircraft by the system 103 according to the maintenance schedule or the predefined maintenance schedule.

According to example implementations of the present disclosure, computer system 101 may be implemented by various means. Means for implementing the computer system may include hardware, alone or under direction of one or more computer programs from a computer-readable storage medium. In some examples, one or more apparatuses may be configured to function as or otherwise implement the computer system shown and described herein. In examples involving more than one apparatus, the respective apparatuses may be connected to or otherwise in communication with one another in a number of different manners, such as directly or indirectly via a wired or wireless network or the like.

Figure 7:
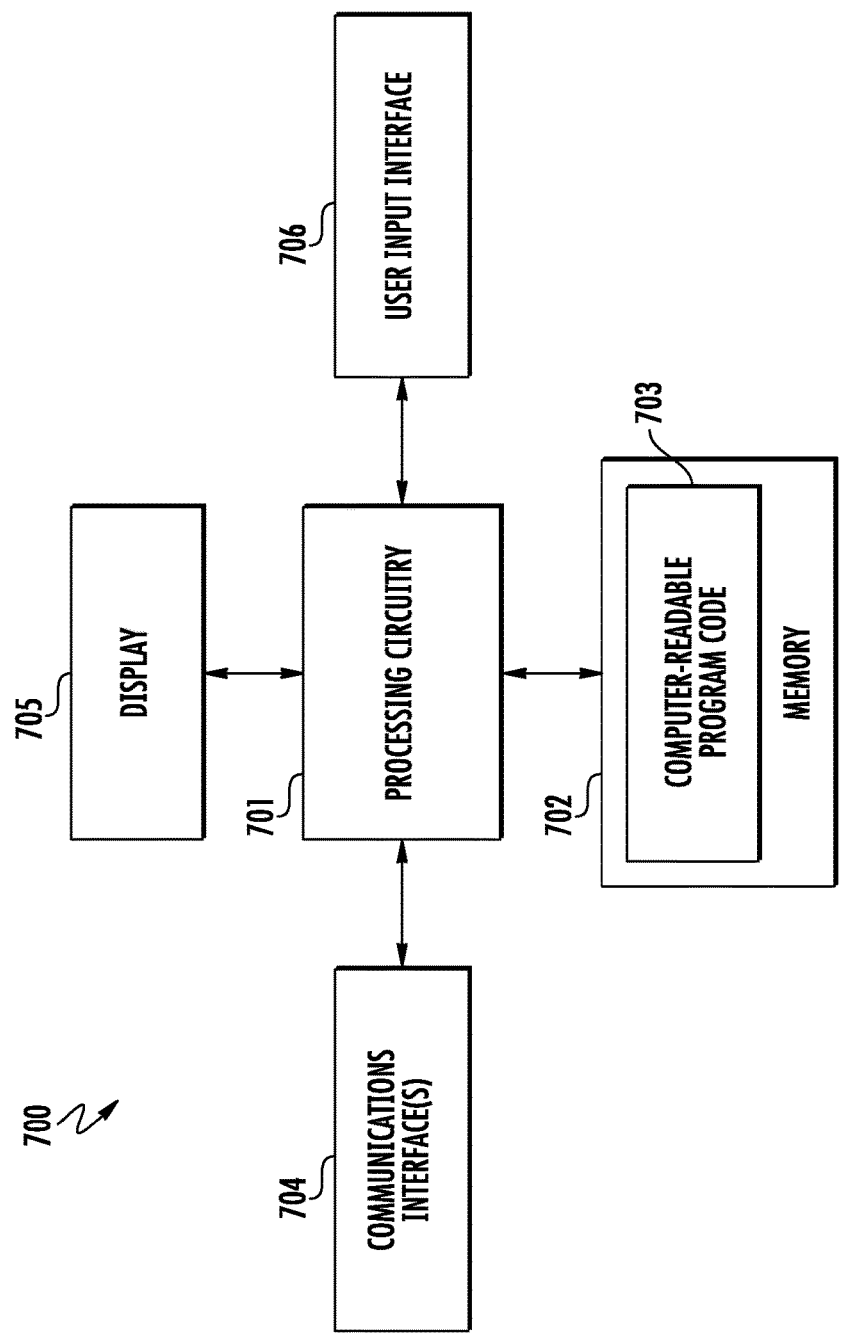
FIG. 7 illustrates an apparatus according to some example implementations.

FIG. 7 illustrates an apparatus 700 according to some example implementations. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processor 701 (e.g., processing circuitry) connected to a memory 702 (e.g., storage device). In some examples, the apparatus 700 includes the computer system 101.

The processor 701 may be composed of one or more processors alone or in combination with one or more memories. The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 702 (of the same or another apparatus).

The processor 701 may be a number of processors, a multi-core processor or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more ASICs, FPGAs or the like. Thus, although the processor may be capable of executing a computer program to perform one or more functions, the processor of various examples may be capable of performing one or more functions without the aid of a computer program. In either instance, the processor may be appropriately programmed to perform functions or operations according to example implementations of the present disclosure.

The memory 702 is generally any piece of computer hardware that is capable of storing information such as, for example, data, computer programs (e.g., computer-readable program code 703) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 702, the processor 701 may also be connected to one or more interfaces for displaying, transmitting and/or receiving information. The interfaces may include a communications interface 704 (e.g., communications unit) and/or one or more user interfaces. The communications interface may be configured to transmit and/or receive information, such as to and/or from other apparatus(es), networks) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 705 and/or one or more user input interfaces 706 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processor that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 700 may include a processor 701 and a computer-readable storage medium or memory 702 coupled to the processor, where the processor is configured to execute computer-readable program code 703 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of performing maintenance on a fleet of aircraft, the method comprising:
 generating a computer model that describes a process performed by a system for in-service operation and maintenance of the fleet of aircraft, wherein the computer model comprises interconnected data objects and modules, the data objects describing at least the fleet of aircraft and a plurality of locations of the system available to perform maintenance on the fleet of aircraft, and the modules describing operations performed by the fleet of aircraft and the system, the data objects and the modules including at least:
  a first data object that includes aircraft attributes that describe aircraft of the fleet of aircraft;
  a second data object that includes location attributes that describe capacity of the plurality of locations to perform maintenance on aircraft of the fleet of aircraft;
  an in-service operation module that describes in-service operation of the fleet of aircraft, at least some of the aircraft attributes of the first data object being updateable based on the in-service operation of the fleet of aircraft;
  a location determination module that describes operation of the system to determine a location from the plurality of locations to perform maintenance on an aircraft of the fleet of aircraft based on the aircraft attributes of the first data object or a demand for maintenance from a predefined maintenance schedule, and based on the location attributes of the second data object; and a maintenance module that describes operation of the system to perform maintenance on the aircraft at the location;

performing a discrete event simulation of the process, via a computer processor configured to access the computer model, to at least execute the modules including the in-service operation module, the location determination module and the maintenance module through a sequence of time-ordered discrete events;

generating a maintenance schedule or certifying the predefined maintenance schedule for the fleet of aircraft from the discrete event simulation of the process; and performing maintenance on the fleet of aircraft by the system according to the maintenance schedule or the predefined maintenance schedule.

2. The method of claim 1, wherein performing the discrete event simulation of the process includes performing the discrete event simulation to execute the in-service operation module and the maintenance module, and from which the at least some of the aircraft attributes of the first data object are updated, including, for each aircraft of the fleet of aircraft, an age, a number of flight hours, an inspection status indicating past maintenance, or a current state indicating current in-service operation.

3. The method of claim 1, wherein performing the discrete event simulation of the process includes performing the discrete event simulation to execute the location determination module to determine the location from the plurality of locations to perform maintenance on the aircraft of the fleet of aircraft using the second data object in which the location attributes of the plurality of locations include, for each location of the plurality of locations, a total capacity to perform maintenance, a current capacity to perform maintenance, or a work placement priority to accept a new maintenance task.

4. The method of claim 1, wherein the data objects and the modules further include a plurality of third data objects that includes task attributes that describe a capability of the plurality of locations to perform maintenance tasks on aircraft of the fleet of aircraft, and wherein performing the discrete event simulation of the process includes performing the discrete event simulation to execute the location determination module to determine the location from the plurality of locations to perform maintenance on the aircraft of the fleet of aircraft further based on the task attributes of the plurality of third data objects.

5. The method of claim 4, wherein generating the computer model includes generating the computer model further including the plurality of third data objects in which the task attributes include, for each location of the plurality of locations, a baseline time to complete a maintenance task, a baseline priority of a maintenance task, or a priority of work-in-progress adjustment.

6. The method of claim 4, wherein the data objects and the modules further include an estimation module that describes operation of the system to estimate a difficulty to perform a maintenance task on the aircraft of the fleet of aircraft based on the aircraft attributes, the difficulty indicating required task attributes to perform the maintenance task on the aircraft, and wherein performing the discrete event simulation of the process includes performing the discrete event simulation to execute the estimation module to estimate the difficulty and thereby determine the required task attributes, and execute the location determination module to determine the location with task attributes matching the required task attributes to perform the maintenance task on the aircraft.

7. The method of claim 1, wherein generating the maintenance schedule includes generating the maintenance schedule that satisfies predefined criteria including a time period that aircraft of the fleet of aircraft are out of service, and wherein certifying the predefined maintenance schedule includes certifying that the predefined maintenance schedule satisfies the predefined criteria.

8. The method of claim 1, wherein the data objects and the modules further include a plurality of fourth data objects that include spare part attributes that describe available spare parts used at the plurality of locations to perform maintenance tasks on aircraft of the fleet of aircraft, and wherein performing the discrete event simulation of the process includes performing the discrete event simulation to execute the maintenance module to perform maintenance on the aircraft at the location based on the spare part attributes of a respective one of the plurality of fourth data objects for the location.

9. The method of claim 1, wherein performing the discrete event simulation of the process includes performing the discrete event simulation according to a user-selected one of at least three simulation modes, including a first simulation mode for generating the maintenance schedule, a second simulation mode for certifying the predefined maintenance schedule, and a third simulation mode for modifying the predefined maintenance schedule.

10. A computer system for supporting maintenance on a fleet of aircraft, the computer system comprising a processor and a memory storing executable instructions that, in response to execution by the processor, cause the computer system to at least:

generate a computer model that describes a process performed by a system for in-service operation and maintenance of the fleet of aircraft, wherein the computer model comprises interconnected data objects and modules, the data objects describing at least the fleet of aircraft and a plurality of locations of the system available to perform maintenance on the fleet of aircraft, and the modules describing operations performed by the fleet of aircraft and the system, the data objects and the modules including at least:

a first data object that includes aircraft attributes that describe aircraft of the fleet of aircraft;

a second data object that includes location attributes that describe capacity of the plurality of locations to perform maintenance on aircraft of the fleet of aircraft;

an in-service operation module that describes in-service operation of the fleet of aircraft, at least some of the aircraft attributes of the first data object being updateable based on the in-service operation of the fleet of aircraft;

a location determination module that describes operation of the system to determine a location from the plurality of locations to perform maintenance on an aircraft of the fleet of aircraft based on the aircraft attributes of the first data object or a demand for maintenance from a predefined maintenance schedule, and based on the location attributes of the second data object; and a maintenance module that describes operation of the system to perform maintenance on the aircraft at the location;

perform a discrete event simulation of the process, via the processor configured to access the computer model, to at least execute the modules including the in-service operation module, the location determination module and the maintenance module through a sequence of time-ordered discrete events;

generate a maintenance schedule or certify the predefined maintenance schedule for the fleet of aircraft from the discrete event simulation of the process; and display the maintenance schedule or the predefined maintenance schedule to support maintenance performed on the fleet of aircraft by the system according thereto.

11. The computer system of claim 10, wherein the computer system being caused to perform the discrete event simulation of the process includes being caused to perform the discrete event simulation to execute the in-service operation module and the maintenance module, and from which the at least some of the aircraft attributes of the first data object are updated, including, for each aircraft of the fleet of aircraft, an age, a number of flight hours, an inspection status indicating past maintenance, or a current state indicating current in-service operation.

12. The computer system of claim 10, wherein the computer system being caused to perform the discrete event simulation of the process includes being caused to perform the discrete event simulation to execute the location determination module to determine the location from the plurality of locations to perform maintenance on the aircraft of the fleet of aircraft using the second data object in which the location attributes of the plurality of locations include, for each location of the plurality of locations, a total capacity to perform maintenance, a current capacity to perform maintenance, or a work placement priority to accept a new maintenance task.

13. The computer system of claim 10, wherein the data objects and the modules further include a plurality of third data objects that includes task attributes that describe a capability of the plurality of locations to perform maintenance tasks on aircraft of the fleet of aircraft, and wherein the computer system being caused to perform the discrete event simulation of the process includes being caused to perform the discrete event simulation to execute the location determination module to determine the location from the plurality of locations to perform maintenance on the aircraft of the fleet of aircraft further based on the task attributes of the plurality of third data objects.

14. The computer system of claim 13, wherein the computer system being caused to generate the computer model includes being caused to generate the computer model further including the plurality of third data objects in which the task attributes include, for each location of the plurality of locations, a baseline time to complete a maintenance task, a baseline priority of a maintenance task, or a priority of work-in-progress adjustment.

15. The computer system of claim 13, wherein the data objects and the modules further include an estimation module that describes operation of the system to estimate a difficulty to perform a maintenance task on the aircraft of the fleet of aircraft based on the aircraft attributes, the difficulty indicating required task attributes to perform the maintenance task on the aircraft, and wherein the computer system being caused to perform the discrete event simulation of the process includes being caused to perform the discrete event simulation to execute the estimation module to estimate the difficulty and thereby determine the required task attributes, and execute the location determination module to determine the location with task attributes matching the required task attributes to perform the maintenance task on the aircraft.

16. The computer system of claim 10, wherein the computer system being caused to generate the maintenance schedule includes being caused to generate the maintenance schedule that satisfies predefined criteria including a time period that aircraft of the fleet of aircraft are out of service, and wherein the computer system being caused to certify the predefined maintenance schedule includes being caused to certify that the predefined maintenance schedule satisfies the predefined criteria.

17. The computer system of claim 10, wherein the data objects and the modules further include a plurality of fourth data objects that include spare part attributes that describe available spare parts used at the plurality of locations to perform maintenance tasks on aircraft of the fleet of aircraft, and wherein the computer system being caused to perform the discrete event simulation of the process includes being caused to perform the discrete event simulation to execute the maintenance module to perform maintenance on the aircraft at the location based on the spare part attributes of a respective one of the plurality of fourth data objects for the location.

18. The computer system of claim 10, wherein the computer system being caused to perform the discrete event simulation of the process includes being caused to perform the discrete event simulation according to a user-selected one of at least three simulation modes, including a first simulation mode for generating the maintenance schedule, a second simulation mode for certifying the predefined maintenance schedule, and a third simulation mode for modifying the predefined maintenance schedule.

19. A computer-readable storage medium for supporting maintenance on a fleet of aircraft, the computer-readable storage medium being non-transitory and having computer-readable program code stored therein that in response to execution by a processor, causes a computer system to at least:

generate a computer model that describes a process performed by a system for in-service operation and maintenance of the fleet of aircraft, wherein the computer model comprises interconnected data objects and modules, the data objects describing at least the fleet of aircraft and a plurality of locations of the system available to perform maintenance on the fleet of aircraft, and the modules describing operations performed by the fleet of aircraft and the system, the data objects and the modules including at least:

a first data object that includes aircraft attributes that describe aircraft of the fleet of aircraft;

a second data object that includes location attributes that describe capacity of the plurality of locations to perform maintenance on aircraft of the fleet of aircraft;

an in-service operation module that describes in-service operation of the fleet of aircraft, at least some of the aircraft attributes of the first data object being updateable based on the in-service operation of the fleet of aircraft;

a location determination module that describes operation of the system to determine a location from the plurality of locations to perform maintenance on an aircraft of the fleet of aircraft based on the aircraft attributes of the first data object or a demand for maintenance from a predefined maintenance schedule, and based on the location attributes of the second data object; and a maintenance module that describes operation of the system to perform maintenance on the aircraft at the location;

perform a discrete event simulation of the process, via the processor configured to access the computer model, to at least execute the modules including the in-service operation module, the location determination module and the maintenance module through a sequence of time-ordered discrete events;

generate a maintenance schedule or certify the predefined maintenance schedule for the fleet of aircraft from the discrete event simulation of the process; and display the maintenance schedule or the predefined maintenance schedule to support maintenance performed on the fleet of aircraft by the system according thereto.

20. The computer-readable storage medium of claim 19, wherein the data objects and the modules further include a plurality of third data objects that includes task attributes that describe a capability of the plurality of locations to perform maintenance tasks on aircraft of the fleet of aircraft, and wherein the computer system being caused to perform the discrete event simulation of the process includes being caused to perform the discrete event simulation to execute the location determination module to determine the location from the plurality of locations to perform maintenance on the aircraft of the fleet of aircraft further based on the task attributes of the plurality of third data objects.

* * * * *